United States Patent
Fang et al.

(10) Patent No.: US 7,488,657 B2
(45) Date of Patent: Feb. 10, 2009

(54) METHOD AND SYSTEM FOR FORMING STRAIGHT WORD LINES IN A FLASH MEMORY ARRAY

(75) Inventors: Shenqing Fang, Fremont, CA (US); Hiroyuki Ogawa, Sunnyvale, CA (US); Kuo-Tung Chang, Saratoga, CA (US); Pavel Fastenko, Sunnyvale, CA (US); Kazuhiro Mizutani, Sunnyvale, CA (US); Zhigang Wang, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 460 days.

(21) Appl. No.: 11/155,707

(22) Filed: Jun. 17, 2005

(65) Prior Publication Data

US 2006/0286750 A1    Dec. 21, 2006

(51) Int. Cl.
    *H01L 21/336* (2006.01)
(52) U.S. Cl. .................. 438/289; 438/257; 438/258; 257/128; 257/202
(58) Field of Classification Search .............. 438/257, 438/258, 286, 289; 257/128, 202, 346, 390
    See application file for complete search history.

(56) References Cited

U.S. PATENT DOCUMENTS

| | | | |
|---|---|---|---|
| 5,789,295 A | 8/1998 | Liu | 438/264 |
| 5,966,601 A * | 10/1999 | Ling et al. | 438/257 |
| 6,765,257 B1 | 7/2004 | Mehrad et al. | 257/314 |
| 7,029,975 B1 * | 4/2006 | Fang et al. | 438/258 |
| 7,238,569 B2 * | 7/2007 | Torii | 438/257 |
| 2003/0022447 A1 * | 1/2003 | Park et al. | 438/257 |
| 2004/0079984 A1 | 4/2004 | Kao et al. | 257/315 |

FOREIGN PATENT DOCUMENTS

| | | |
|---|---|---|
| EP | 0766316 A1 | 4/1997 |
| EP | 1073121 A2 | 1/2001 |
| JP | 10189919 | 7/1998 |
| JP | 2002100689 | 4/2002 |

* cited by examiner

*Primary Examiner*—Phuc T Dang

(57) ABSTRACT

Embodiments of the present invention disclose a memory device having an array of flash memory cells with source contacts that facilitate straight word lines, and a method for producing the same. The array is comprised of a plurality of non-intersecting shallow trench isolation (STI) regions that isolate a plurality of memory cell columns. A source column is implanted with n-type dopants after the formation of a tunnel oxide layer and a first polysilicon layer. The implanted source column is coupled to a plurality of common source lines that are coupled to a plurality of source regions associated with memory cells in the array. A source contact is coupled to the implanted source column for providing electrical coupling with the plurality of source regions. The source contact is collinear with a row of drain contacts that are coupled to drain regions associated with a row of memory cells. The arrangement of source contacts collinear with the row of drain contacts allows for straight word line formation.

8 Claims, 10 Drawing Sheets

METHOD AND SYSTEM FOR FORMING STRAIGHT WORD LINES IN A FLASH MEMORY ARRAY

TECHNICAL FIELD

The present invention relates to the field of semiconductor memory devices. Specifically, the present invention relates to a nonvolatile semiconductor memory device including a NOR type array of flash memory cells exhibiting straight word lines, having a source column implanted with n-type dopants after the deposition of a tunnel oxide layer and a first polysilicon layer during the fabrication process.

BACKGROUND

A flash or block erase memory (flash memory), such as, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal Oxide Semiconductor Field Effect Transistor (MOSFET) memory cells, each of which includes a source, a drain, a floating gate and a control gate to which various voltages can be applied to program and erase each cell. Programming occurs by using hot electron injection to trap electrons on the floating gate, thereby raising the threshold voltage of the cell. Erasing employs the Fowler-Nordheim tunneling effect to decrease the number of electrons on the floating gate, thereby lowering the threshold voltage of the cell. Upon reading, each programmed cell reads as a binary 0, and each erased level within a cell reads as a binary 1. Flash memory cells provide for nonvolatile data storage.

The cells are connected in an array of rows and columns, with the control gates of the cells in a row being connected to a respective wordline and the drains of the cells in a column being connected to a respective bitline. The sources of the cells are connected together. One example of this kind of arrangement is a NOR memory configuration.

FIG. 1 illustrates a planar view of a typical configuration of a section of a memory array 100 in a NOR memory configuration. FIG. 1 is not drawn to scale. As shown in FIG. 1, the array 100 is comprised of rows 110 and columns 120 of memory cells. Each of the memory cells is isolated from other memory cells by insulating layers (e.g., a plurality of shallow trench isolation regions (STI) 150.

The control gates of each of the memory cells are coupled together in each of the plurality of rows 110 of memory cells, and form a plurality of word lines 130 that extend along the row direction.

Bit lines extend in the column direction and are coupled to drain regions via drain contacts 160 in an associated column of memory cells 120. The bit lines are coupled to drain regions of memory cells in associated columns of memory cells 120.

A plurality of source lines 140 extend in the row direction and are coupled to the source regions of each of the memory cells in the array of memory cells 100. One source line is coupled to source regions in adjoining rows of memory cells, and as a result, one source region is shared between two memory cells. Similarly, drain regions are shared amongst adjoining rows of memory cells, and as a result, one drain region is shared between two memory cells.

Each of a plurality of source contacts is coupled to the plurality of common source lines 140. Each of the plurality of source contacts 145 is formed in line with the associated common source line to which it is coupled. The source contacts are formed in a column 147, and may be connected with each other. The column 147 is isolated between two STI regions and forms a dead zone in which no memory cells are present.

As shown in FIG. 1, due to current photolithography limitations in forming contact vias, the space required for each of the plurality of source contacts 145 is larger than their associated common source lines 140. As a result, the common source lines 140 need to be widened in the region surrounding their associated source contacts 145. This is to accommodate the wider source contacts 145. As such, word lines on either side of the common source line 140 are bent to accommodate for the increased area for the common source line surrounding an associated source contact 145.

However, as the size of each memory cell and correspondingly, the array 100 itself is reduced, the bending of the word lines to accommodate for the size of the source contacts is limited by current photolithography and chemical vaporization deposition (CVD) techniques. For example, as the size shrinks, it becomes more difficult to form a pronounced bend in each of the plurality of word lines 130 at current pitches achievable by current photolithography techniques. As a result, the size of the overall array 100 is limited by the ability to bend the word lines 130.

Furthermore, the inability to form straight word lines in the region surrounding the source contacts 145 effects the uniformity of cells throughout the array 100. Specifically, the memory cells bordering the column 147 of source contacts that includes the source contacts 145 may have electrical characteristics (erase and program) that are different than those memory cells that do not border a column of source contacts. Threshold voltage and current leakage are specific problems. In particular, a change in the erasing characteristics of a memory cell bordering the column 147 of source contacts can alter the threshold voltage of the cell into the negative region. This causes cell current to always flow (leakage) irrespective of the associated word line potential. As such, memory cells lying on the same bit line as the defective cell will have an erroneous state being read.

SUMMARY OF THE INVENTION

A method of forming an implanted source column in an array of memory cells as a way of forming straight word lines, as well as a device having an array fabricated by that method, are disclosed. Beginning with a silicon substrate striped with columns of filled shallow isolation trenches, a layer of tunnel oxide is formed over the substrate, followed by a first polysilicon layer. A mask is then formed over the first polysilicon layer to expose and isolate a column of the silicon substrate parallel to the shallow isolation trenches. Dopants are then implanted through the first polysilicon layer and the layer of tunnel oxide and into the isolated column in the silicon substrate to form an implanted source column, to be coupled with source regions in memory cells in the array of memory cells.

It is appreciated that FIGS. 1-5, 6A and 6B, and 7A-7G are drawn for illustrative purposes only and are not drawn to scale.

DETAILED DESCRIPTION

Reference will now be made in detail to the preferred embodiments of the present invention, a semiconductor memory including a core memory array of memory cells with source line connections that facilitate straight word lines, and a method for producing the same. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a memory device with better uniformity of performance between memory cells in an array of memory cells, more compactness in the array of memory cells, and higher yields for the array. Also, the present invention discloses a method for forming source line connections that facilitate easier fabrication of straight word lines in an array of memory cells using current photolithography techniques.

Figure 1:
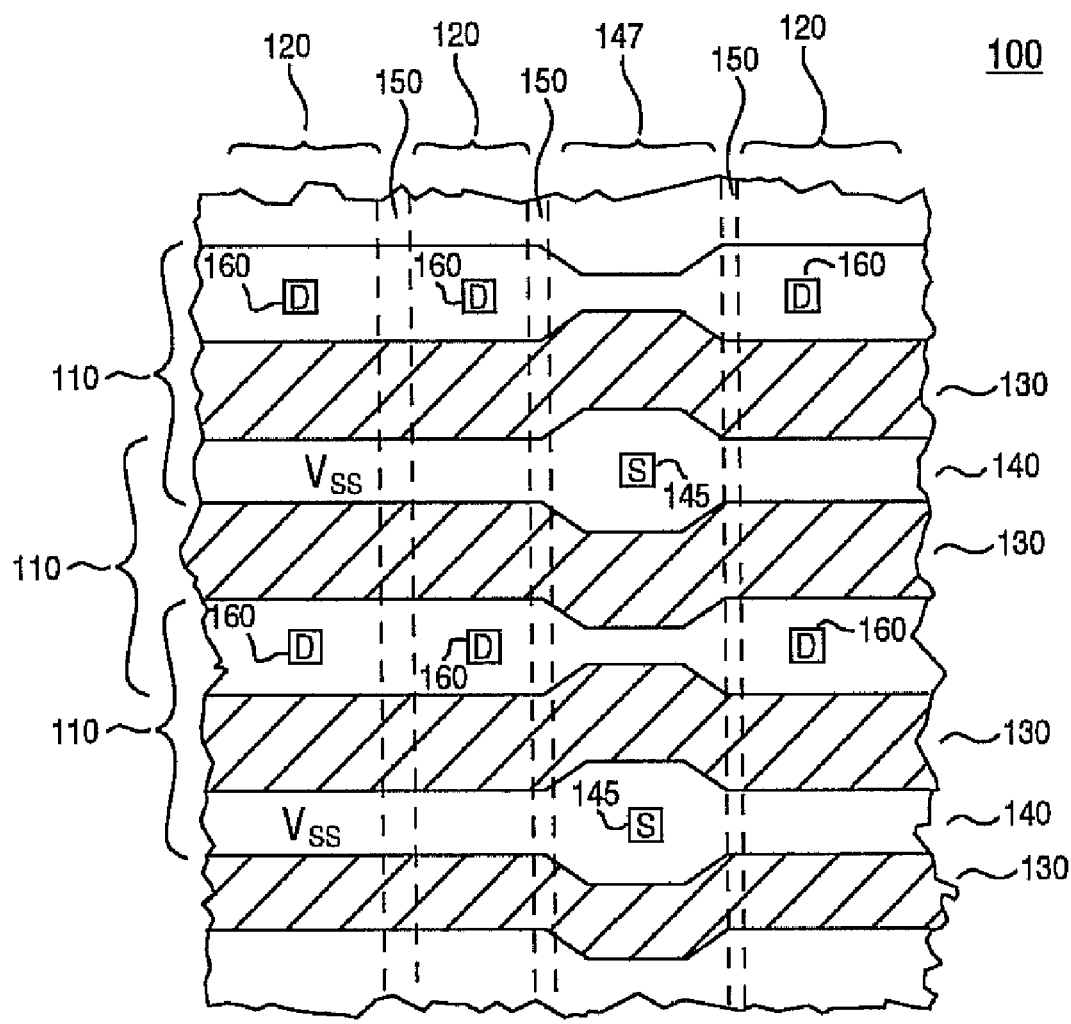
FIG. 1 is a planar view of a section of a core memory array of memory cells in a semiconductor memory.
Figure 2:
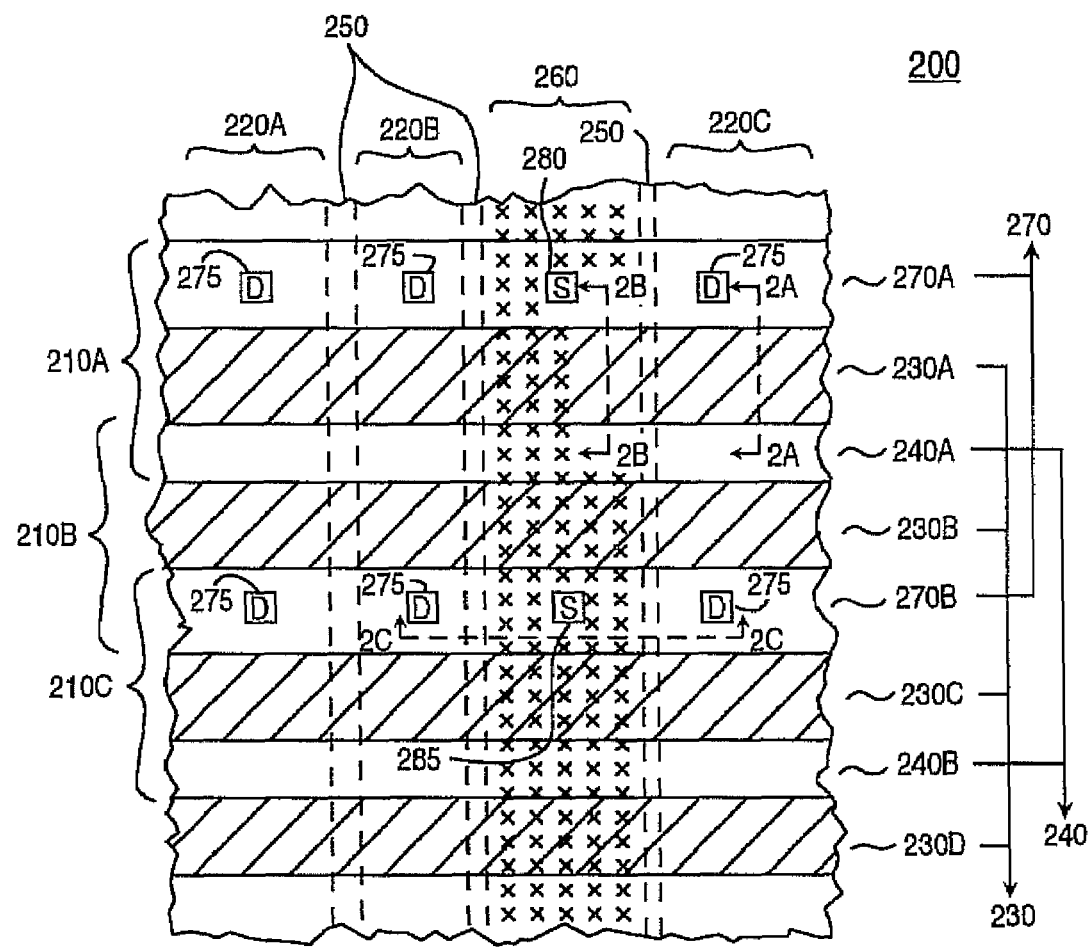
FIG. 2 is a planar view of a section of a core memory array of memory cells including a source column, in accordance with one embodiment of the present invention.

FIG. 2 is a planar view of a section of the core array of memory cells 200 illustrating a common source line 260 and an arrangement of source line connections 280 that facilitates the formation of straight word lines (e.g. 230A), in accordance with one embodiment of the present invention. As shown in FIG. 2, the array 200 comprises a plurality of rows 210 of memory cells (e.g., row 210A, 210B, 210C, etc.). The array 200 also comprises a plurality of columns 220 of memory cells (e.g., column 220A, 220B, 220C, etc.). Each of the memory cells are isolated from other memory cells by insulating layers. A plurality of non-intersecting shallow trench isolation regions (STI) 250 isolate memory cells along the row direction.

The control gates of each of the memory cells in the array 200 are coupled together in each of the plurality of rows 210 of memory cells, and form a plurality of word lines 230 that extend along the row direction, in accordance with one embodiment of the present invention. The plurality of word lines comprises word lines 230A, 230B, 230C, 230D, etc.

Bit lines (not shown) extend in the column direction and are coupled to drain regions of associated memory cells via a plurality of drain contacts 275 in associated columns of memory cells 220. As such, each of the bit lines is coupled to drain regions of memory cells in associated columns of memory cells 220.

A plurality of source lines 240 extend along the row form source regions for each of the memory cells in the array of memory cells 200. The plurality of source lines 240 are comprised of source lines 240A, 240B, etc. as shown in FIG. 2. For example, source line 240A forms source regions for memory cells in row 210A and 210B. The source lines for rows 210A and 210B are connected with the common source column 260 underneath the stacked gate structure of word line 230A. As such, the source lines 240 in the plurality memory cells 200 are electrically coupled. Within the fabrication process, each of the source contacts (e.g. 280, 285) are formed similarly and simultaneously to couple with the underlying source column 260.

Similarly, drain regions (e.g. 270A) are shared amongst adjoining rows of memory cells. One drain line 270 forms drain regions for two rows of memory cells (e.g. 210B and 210C). Also, as shown in FIG. 2, each of the rows of memory cells 210 has an associated row of drain contacts 270 in the plurality of rows of drain contacts comprised of rows 270A, 270B, etc. For example, row 210A is associated with the row 270A of drain contacts. Within the fabrication process, each of the drain contacts 275 are formed similarly and simultaneously to couple with the underlying drain regions of each of the memory cells in the array 200.

FIG. 2 is exemplary only, and the pattern of word lines, source lines, and bit lines can be altered for performance reasons. For example, in one embodiment, each of the plurality of source lines 240 of FIG. 2 is a common source line. In addition, in one embodiment, the pattern of word lines, source lines, and bit lines coupled to the array of memory cells 200 is shown in a NOR type configuration. However, other embodiments are well suited to arrays of other logical configurations.

Importantly, FIG. 2 illustrates the formation of a source column 260 for providing electrical coupling to the source regions of each of the memory cells in the array 200, in accordance with one embodiment of the present invention. The source column 260 is implanted with n-type dopants, in general. Typical n-type dopants can be taken from a group consisting of arsenic, phosphorous, and antimony in one embodiment; however, other embodiments are well suited to any n-type dopants suitable for fabrication of memory cells. As shown in FIG. 2, the source column 260 is formed perpendicular to each of the plurality of rows of memory cells 210, and in particular, to each of the plurality of common source lines 240.

The source column 260 is isolated between an adjoining pair 250A of the plurality of non-intersecting STI regions 250. As such, the source column 260 is electrically isolated from adjoining memory cells on either side of the adjoining pair 250A of STI regions. The source column 260 is also permanently coupled to a plurality of common source lines 240. As previously discussed, the plurality of common source lines 240 is coupled to a plurality of source regions in the array 200. As such, the source regions in the array 200 are electrically coupled to each other through the plurality of common source lines and the source column 260.

In addition, FIG. 2 illustrates the formation of a source contact 280 that is coupled to the source column 260. The source contact 280 provides for electrical coupling with each of the plurality of source regions in memory cells of the array 200 through the source column and the plurality of common source lines 240.

In one embodiment, the source contact is located along one of the plurality of rows 270 of drain contacts (e.g., row 270A of drain contacts). As such, the source contact 280 is formed similarly and simultaneously in the fabrication process as the plurality of drain contacts 275 in the row 270A of drain contacts. In one embodiment, the source contact 280 is of the same size and dimension as the drain contacts 275 in the associated row of drain contacts 270A. The source contact 280 provides for electrical coupling to the source column 260, and as such, to each of the source regions of memory cells in the array 200. In another embodiment, the source contact is of a different dimension than an associated row of drain contacts.

In another embodiment, a second source contact 285 is formed to couple with the source column 260. By strapping the source column 260 with a second source contact 285, the resistance in the plurality of common source lines 240 is reduced. The second source contact 285 is formed in a second row of drain contacts 270B that are coupled to drain regions of a second row of memory cells. In another embodiment, each of the plurality of rows of drain contacts 270 that is associated with the plurality of rows of memory cells 210 has a source contact formed in the source column 260.

The location of the source contact 280 along the row of drain contacts 275 enables the straight formation of a word line (e.g., 230A) that intersects the source column 260 near the source contact 280. Instead of forming the source contact 280 in line with an associated source line (e.g., 240A) from the plurality of common source lines 240, the source contact is moved and formed along one of the plurality of rows of drain contacts 275 (e.g., row 270A). The drain contacts 275 in each of the rows of memory cells 210 are arranged perpendicularly to the source column 260.

Since there is more space allowed to form the source contact (e.g., 280) along the row of drain contacts 270A than in one of the plurality of common source lines 240, each of the plurality of word lines 230 does not need to be adjusted, or bent, through photolithography techniques in order to accommodate for the source contact 280. As such, the word lines (e.g., word line 230A) that intersect the source column 260 on either side of the row of drain contacts 270A that includes the source contact 280 will maintain a uniform and straight formation in the fabrication process.

Similarly, by forming a plurality of source contacts (e.g., 280 and 285) in each of the plurality of rows of drain contacts 270, each of the plurality of word lines 230 that intersects the source column 260 near one of the plurality of source contacts can maintain a uniform and straight formation in the fabrication process. In addition, by locating the plurality of source contacts in line with the plurality of drain contacts 270, each of the plurality of rows of memory cells 210 is smaller than each of the plurality of rows of memory cells 110 of FIG. 1. By locating the plurality of source contacts (e.g., 280 and 285) in the plurality of rows 270, the word lines do not require any bending.

In another embodiment, a second source column (not shown) is also implanted with n-type dopants and isolated between a second adjoining pair of the plurality of non-intersecting STI regions 250. The second source column is also coupled to the plurality of common source lines 240. In addition, source contacts are formed in the second source column similarly in the plurality of rows of drain contacts 270, as previously discussed. The second source column is located x columns of memory cells from the source column 260 as shown in FIG. 2 for reducing resistance in the plurality of common source lines. The number x can be any number, but typically is between 15 and 35.

Figure 3:
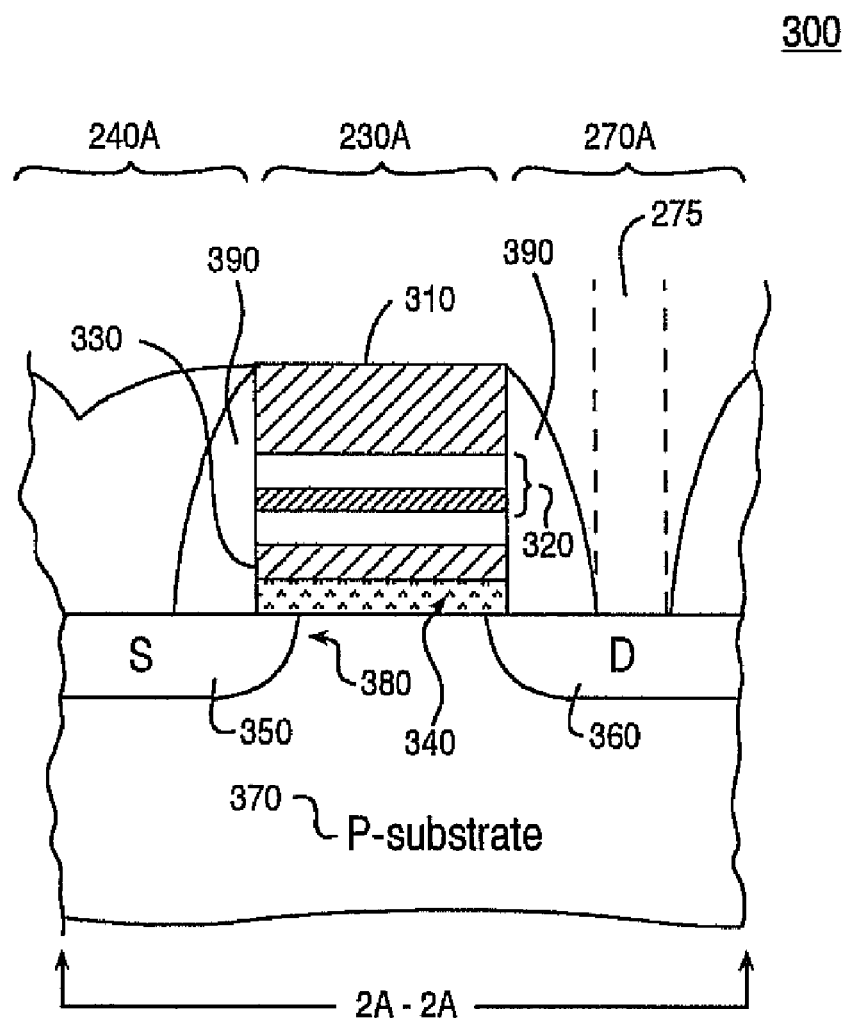
FIG. 3 is a cross sectional view of the core memory array of memory cells of FIG. 2 taken along line 2A-2A illustrating an exemplary semiconductor flash memory cell, in accordance with one embodiment of the present invention.

FIG. 3 is a cross sectional diagram 300 of the array of memory cells 200 taken along line 2A-2A of FIG. 2, in accordance with one embodiment of the present invention. FIG. 3 illustrates the formation of a flash memory cell in one embodiment; however, other embodiments can include the formation of additional types of memory cells. FIG. 3 is a cross-sectional diagram of flash memory cell 300 including a tunnel oxide dielectric 340. The tunnel oxide dielectric 340 is sandwiched between a conducting polysilicon floating gate 330 and a crystalline silicon semiconductor substrate 370 (e.g., a p-substrate). The substrate 370 includes a source region 350 and a drain region 360 that can be separated by an underlying channel region 380. A control gate 310 is provided adjacent to the floating gate 330, and is separated by an interpoly dielectric 320. Typically, the interpoly dielectric 320 can be composed of an oxide-nitride-oxide (ONO) structure. In one embodiment, the control gate 310 forms the word line 230A of FIG. 2.

The flash memory cell 300 can be adapted to form a p-channel flash memory cell or an n-channel flash memory cell depending on user preference, in accordance with embodiments of the present invention. Embodiments of the present inventions are well suited to implementation within a p-channel or n-channel flash memory cell. Appropriate changes in the FIGS. 2-5 are necessary to reflect implementation of p-channel or n-channel devices.

FIG. 3 also illustrates optional sidewall spacers 390 formed on either side of the flash memory cell 300 for insulating the stacked gate formation of the flash memory cell 300. FIG. 3 also illustrates source line 240A that, according to one embodiment of the present invention, is coupled to the source region 350 of the flash memory cell 300. The common source line 240A as shown in FIG. 3 is permanently coupled to a source column 260 in FIG. 2. In addition, a drain contact 275 is shown that is one of an associated row of drain contacts 270A in an row 210A of memory cells that includes flash memory cell 300.

Figure 4:
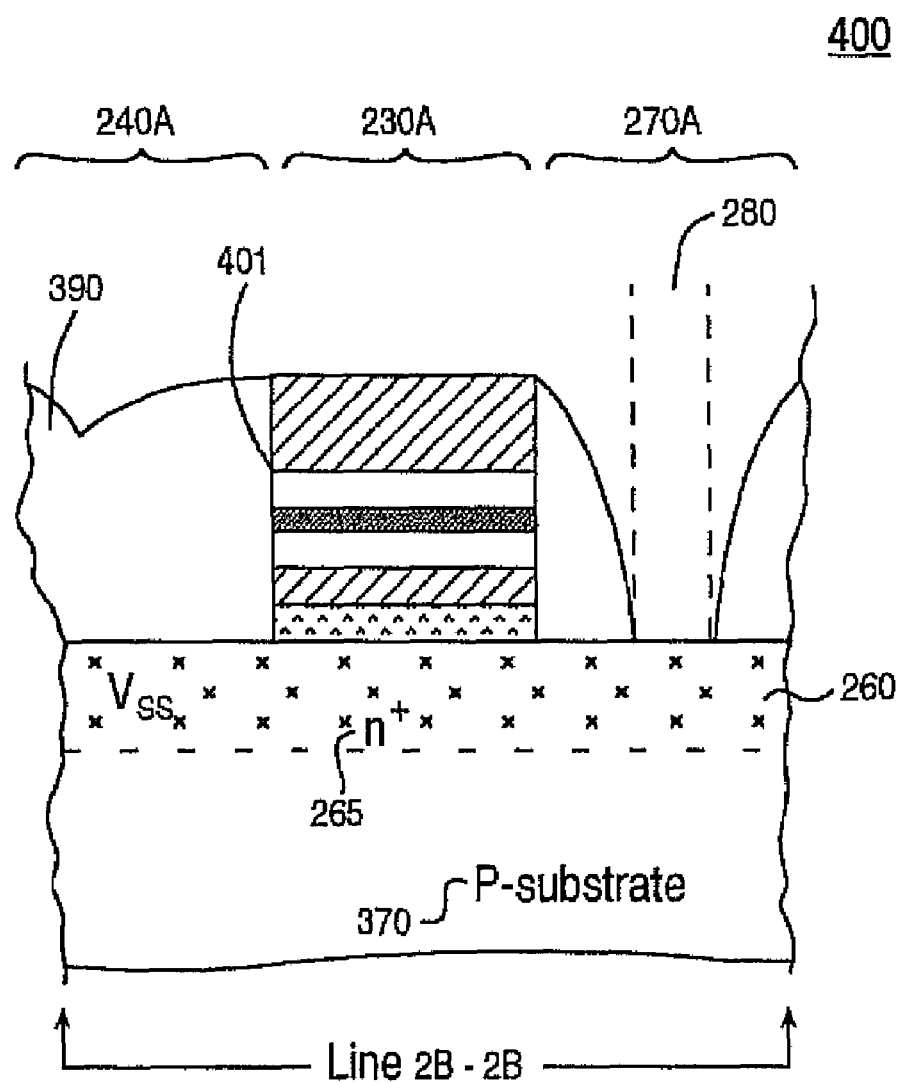
FIG. 4 is a cross sectional view of the core memory array of memory cells of FIG. 2 taken along line 2B-2B illustrating the implantation of n-type dopants in the source column, in accordance with one embodiment of the present invention.

FIG. 4 is a cross sectional diagram of the array 200 of memory cells taken along line 2B-2B of FIG. 2, in accordance with one embodiment of the present invention. FIG. 4 illustrates the formation of a stacked gate structure 401 over the source column 260 designated by the n-type dopants 265 as shown in FIG. 4.

Additionally, FIG. 4 illustrates the formation of a complete stacked gate structure 401 (e.g., including tunnel oxide, floating gate, ONO insulating layer, and control gate) that is formed in the fabrication process of the array 200; however, the stacked gate structure 401 in FIG. 4 is inactive, since the source and drain regions are connected, according to an embodiment of the present invention. Also, in other embodiments the stacked gate structure may or may not include all the components of the stacked gate structure as shown in FIG. 4 for various fabrication and performance reasons.

Also, FIG. 4 illustrates the source column 260 implanted with n-type dopants 265 (e.g., $n^+$ dopants) over a p-type substrate 370, in accordance with one embodiment of the present invention. A common source line 240A is permanently coupled to the source column 260. In addition, a source contact 280 is formed and coupled to the source column 260, as shown in FIG. 4. The source column 260 provides for electrical coupling between the source contact 280 and the common source line 240A.

Figure 5:
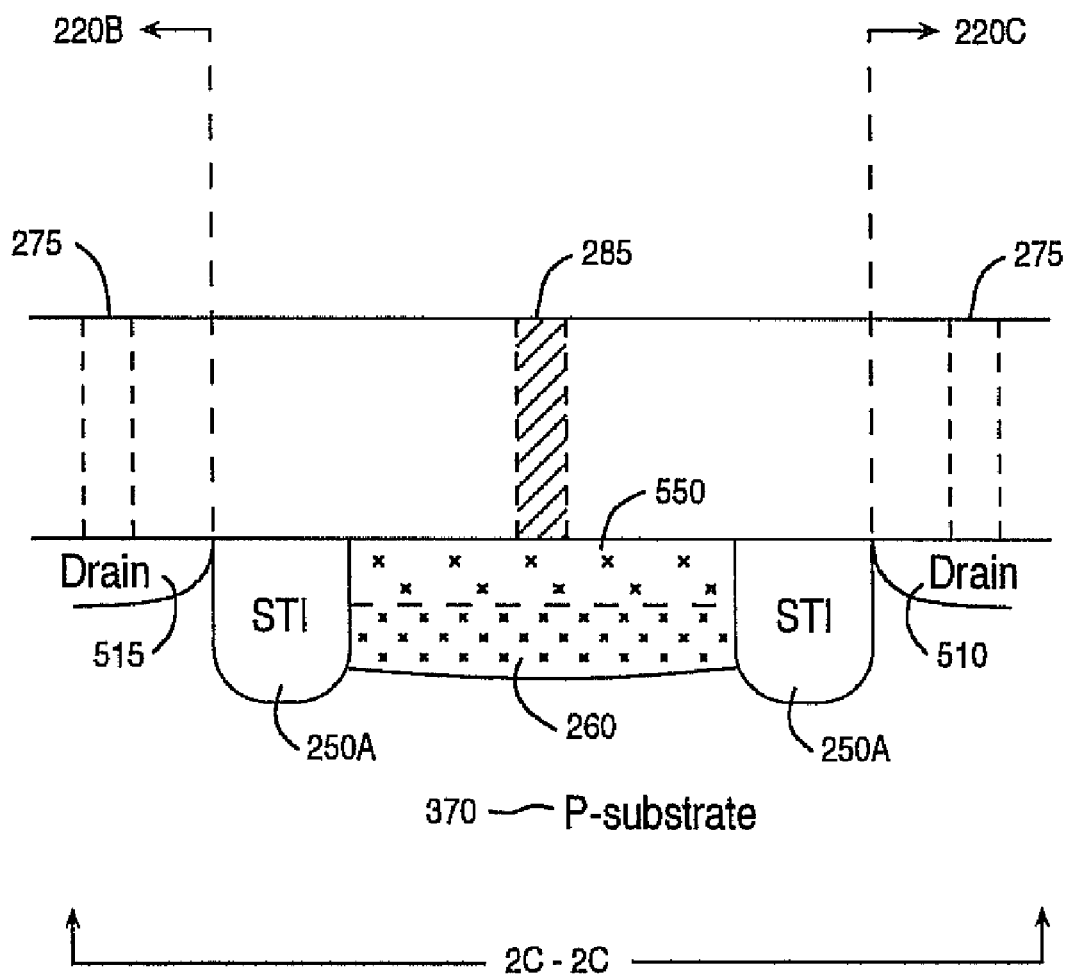
FIG. 5 is cross sectional view of the core memory array of memory cells of FIG. 2 taken along line 2C-2C illustrating the formation of the source contact along a row of drain contacts, in accordance with one embodiment of the present invention.

FIG. 5 is a cross sectional diagram of the array 200 of memory cells taken along line 2C-2C of FIG. 2, in accordance with one embodiment of the present invention. FIG. 5 illustrates the formation of a region 500 in the array 200 of memory cells that spans across three columns (column 220B, 220C and source column 260).

FIG. 5 illustrates the formation of the source contact 285 along the row 270B of drain contacts 275 in the associated row of memory cells 210B. In one embodiment, FIG. 5 illustrates that the source contact 285 is of similar dimensions to the drain contacts 275.

In addition, STI regions of the pair 250A of STI regions isolate two columns of memory cells (220B and 220C). Drain regions 510 and 515 are shown of memory cells in the columns 220B and 220C, respectively, of memory cells. A source column 260 is shown isolated between the pair 250A of STI regions.

Also, a drain-like implanted region 550 is shown under the source contact 285, in one embodiment. The drain-like implanted region 550 is formed simultaneously with the formation of all drain regions in the core memory cell (e.g., drain region 510 and drain region 515) for process simplicity. As such, the drain-like implanted region 550 is of similar doping concentration and depth as the drain region 510 and drain region 515. In addition, in one embodiment, the doping concentration of the drain-like implanted region 550 is similar to the doping concentration of the source column 260.

Figure 6A:
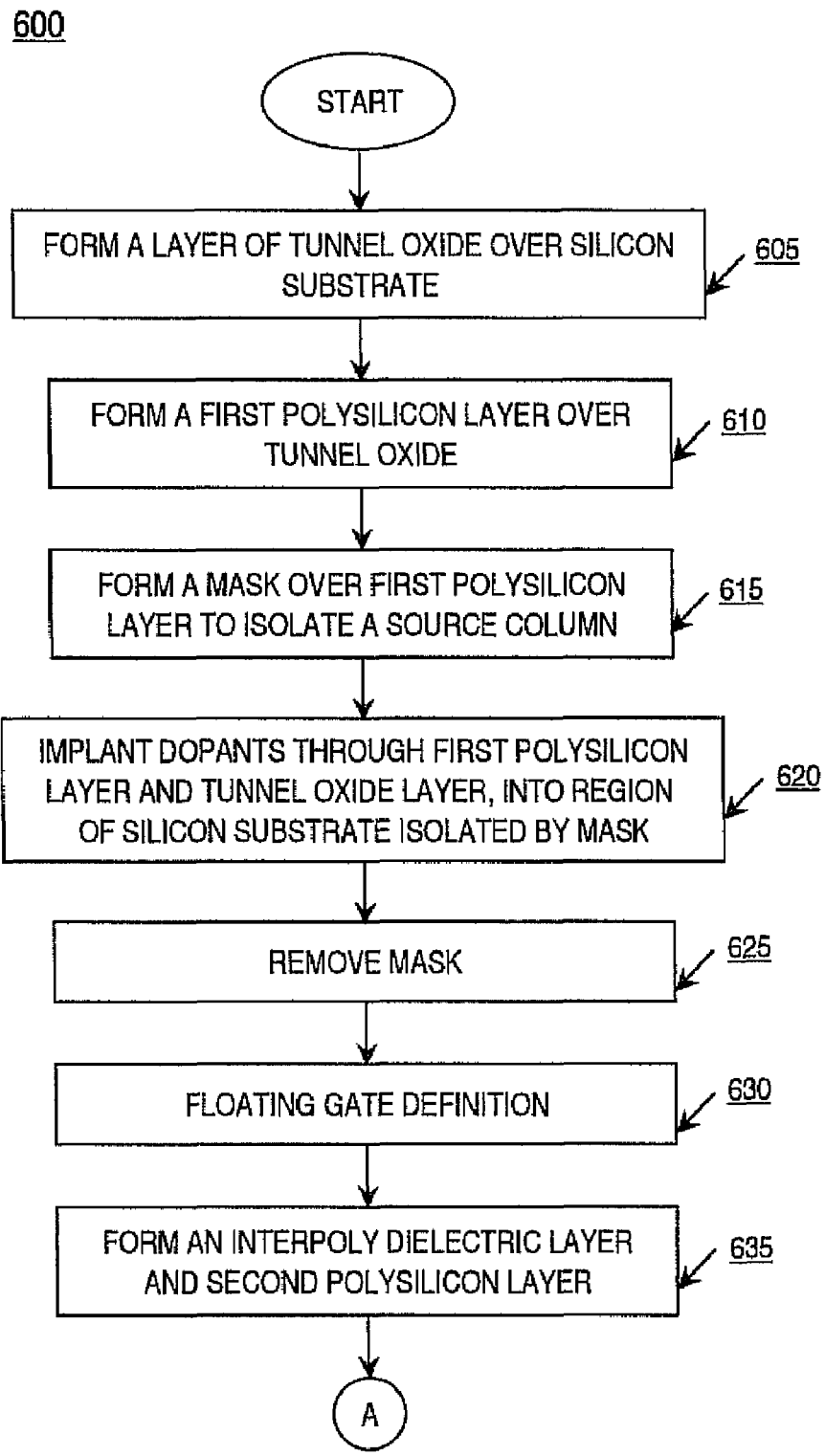
FIGS. 6A and 6B form a flow chart 600 illustrating steps in a method for the fabrication of a source column in a core array of memory cells with source line connections that facilitate straight word lines, in accordance with one embodiment of the present invention.
Figure 6B:
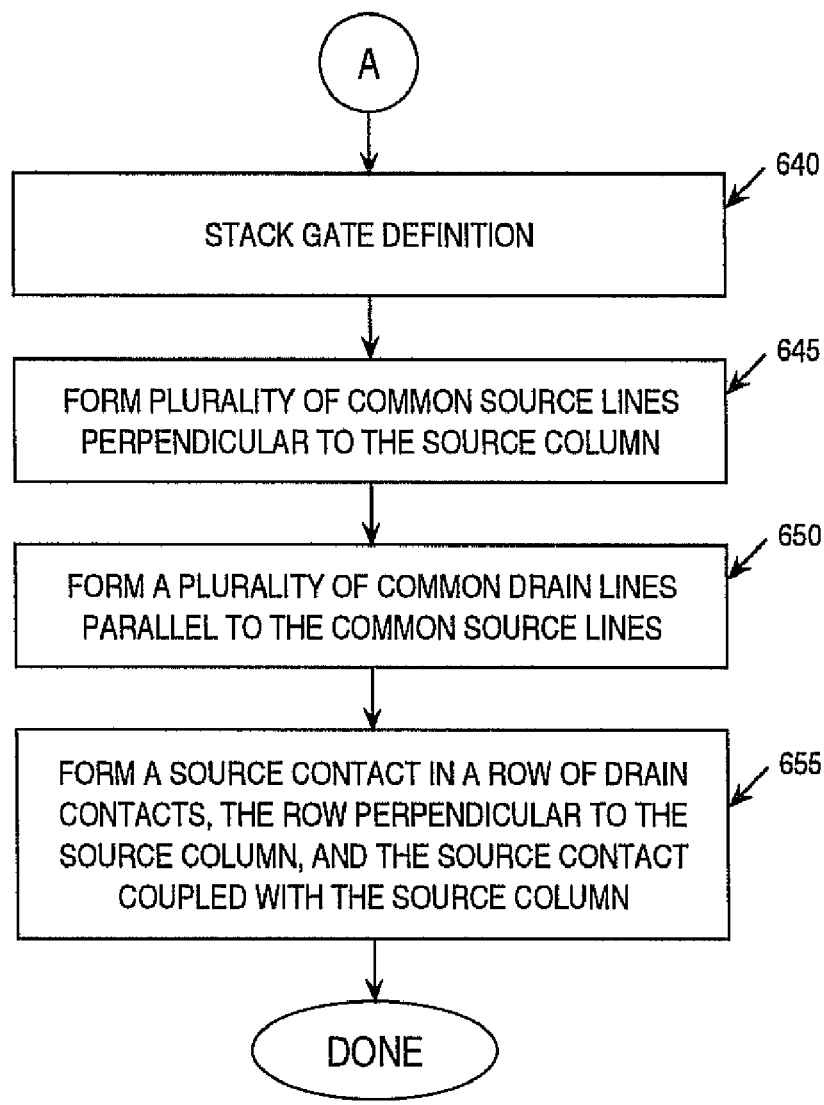

FIGS. 6A, 6B and 7A-7G illustrate fabrication steps implemented to form a source column with associated source line contacts in an array of memory cells that does not require any word line bending, in accordance with one embodiment of the present invention. FIGS. 6A and 6B form a flow chart 600 of steps in a method for forming the source line contact in an array of memory cells that does not require any word line bending. FIGS. 7A-7G illustrate fabrication steps implemented to form the source line contact as disclosed in flow chart 600.

The present embodiment begins with a silicon substrate having a plurality of STI regions in non-intersecting columns. The plurality of STI regions isolates a plurality of columns of silicon in the silicon substrate. The plurality of STI regions are filled with an oxide material.

Figure 7A:
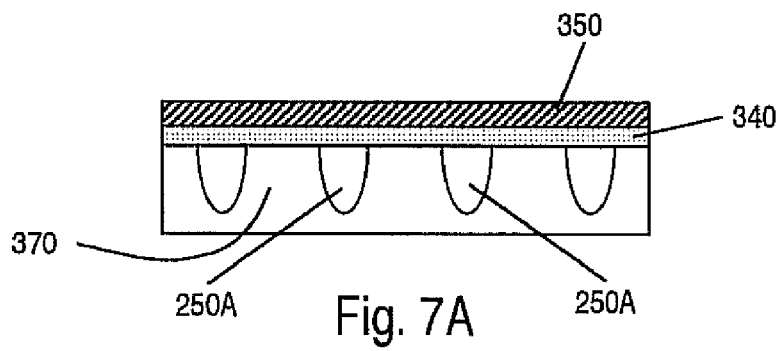
FIGS. 7A-7G illustrate fabrication steps as outlined in flowchart 600 for the fabrication of a source column in a core array of memory cells with source line connections that facilitate straight word lines, in accordance with one embodiment of the present invention.

Step 605 in flow chart 600 is the formation of a layer of tunnel oxide over a silicon substrate having a plurality of STI regions, followed by the formation of a first layer of polysilicon (over the tunnel oxide layer) in step 610. The results of steps 605 and 610 in flow chart 600 are illustrated in FIG. 7A. A layer of tunnel oxide 340 is formed over a silicon substrate 370 having STI regions 250A filled with oxide material. A first layer of polysilicon 350 is formed over the layer of tunnel oxide 340. The first layer of polysilicon 350 will later form floating gates in the array of memory cells.

Figure 7B:
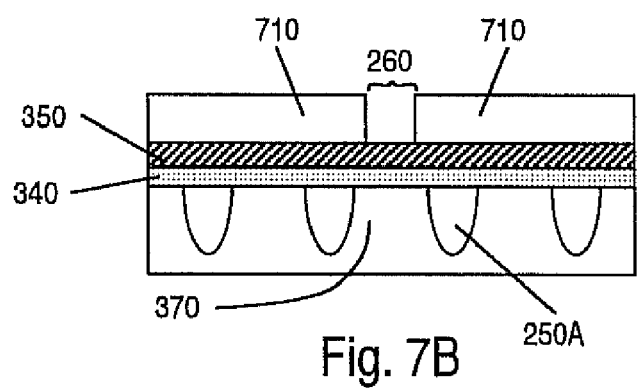

After the formation of the first polysilicon layer, flow chart 600 proceeds to step 615, the formation of a mask over the layer of polysilicon to isolate a source column parallel to the STI regions in the silicon substrate. Step 615 is depicted in FIG. 7B, where a mask 710 is formed over polysilicon layer 350, isolating a source column 260 parallel to the STI regions 250A in the silicon substrate 370. In one embodiment, mask 701 is formed by deposition of a layer of a photoresist, then using lithography to define the photoresist.

Figure 7C:
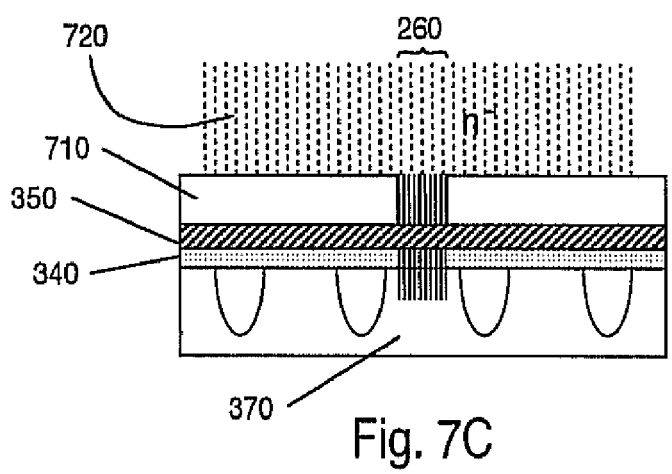

N-type dopants are then implanted into the exposed region of the silicon substrate to form the source column, as described in step 620 of flow chart 600 and illustrated in FIG. 7C. FIG. 7C depicts the implantation 720 of n-type dopants through the first polysilicon layer 350 and the tunnel oxide layer 340 and into the silicon substrate 370 in the exposed source column 260. The regions of the silicon substrate 370, polysilicon 350 and tunnel oxide 340 covered by mask 710 will later form respective source, drain and stacked gates regions of the memory cell. N-type dopants can be implanted in any method suitable for implanting n-type dopants into the selected source column 260.

Figure 7D:
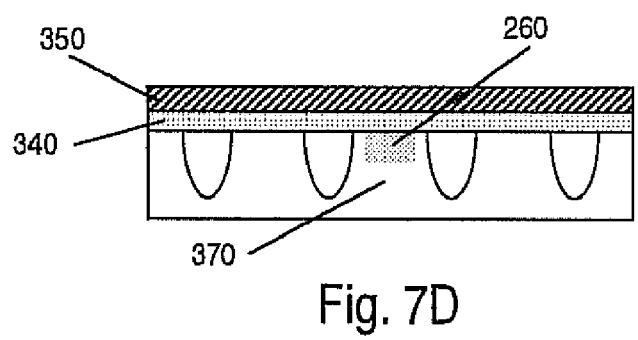

After implantation 720 of the n-type dopants in the source column 260, the mask 710 is removed, as in step 625 of FIG. 6A. FIG. 7D illustrates the source column 260 with the implantation of the n-type over a p-type substrate 370, in accordance with one embodiment of the present invention. As such, the formation of the source column 260 requires the additional steps of masking, implantation, and removing the mask layer, as implemented in current fabrication techniques.

Figure 7E:
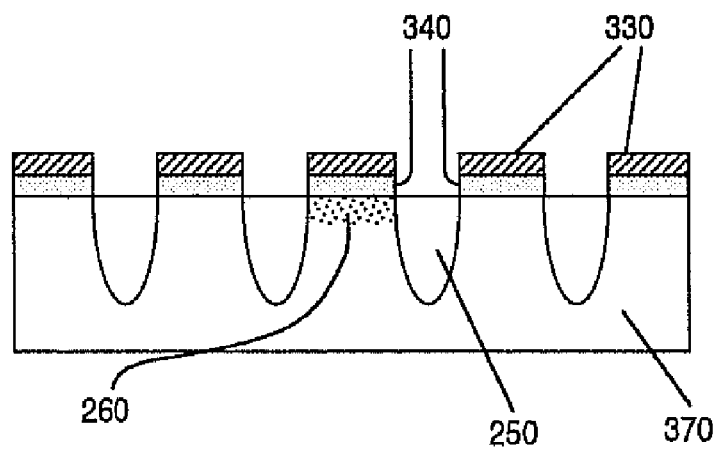
Figure 7F:
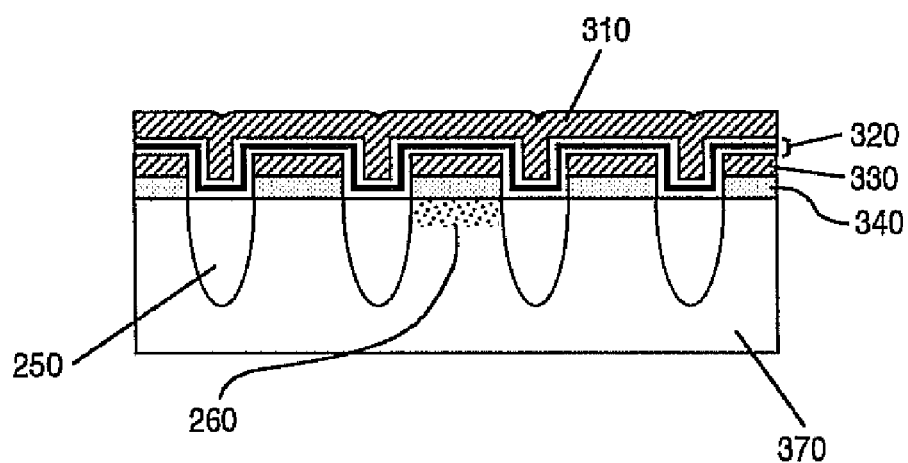

According to one embodiment of the present invention, the next step in the fabrication process is the floating gate definition as recited in step 630 and illustrated in FIG. 7E. In one embodiment, floating gate definition is accomplished by a mask and etch process. Referring now to FIG. 7E, the patterned first polysilicon layer 350 will form floating gates for stack gates in memory cells in an array. After floating gate definition, step 635 in FIG. 6A describes formation of an interpoly dielectric layer 320 and a second polysilicon layer 310, as depicted in FIG. 7F. In one embodiment, the interpoly dielectric layer is an ONO structure. An ONO structure 320 is formed over the defined first polysilicon layer 340, and a second polysilicon layer 310 is formed over the ONO structure 320. Flowchart 600 then proceeds to FIG. 6B, and the step 640 of stack gate definition. In one embodiment, step 640 entails a mask and etch process to pattern the second polysilicon layer to form control gates for stack gates in memory cells in array 200.

Figure 7G:
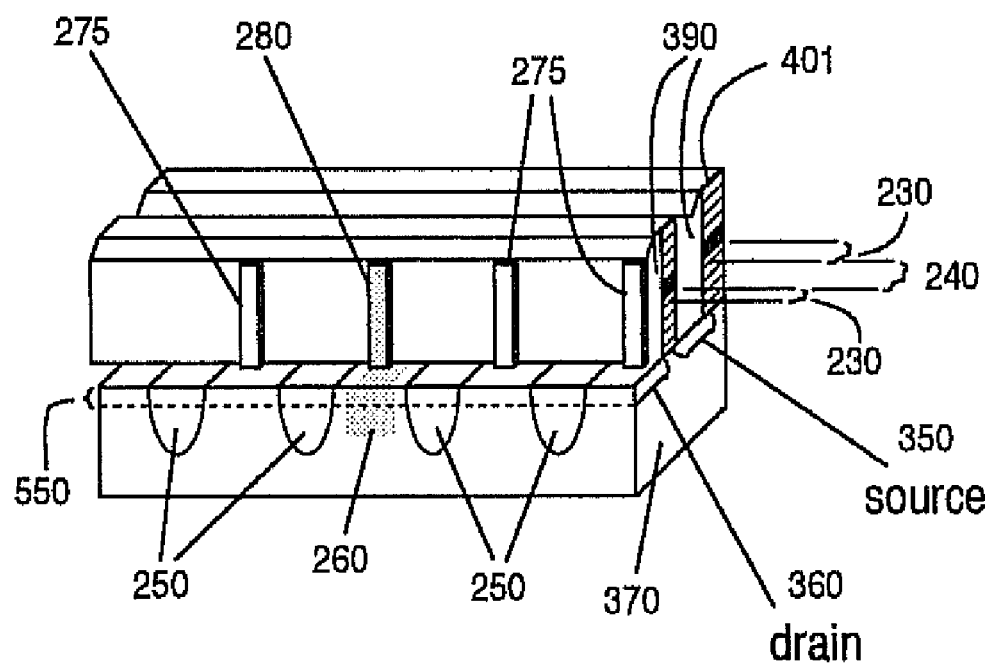

Partially defined stack gates are depicted in FIG. 7G, in the word lines 230. The plurality of word lines 230 are non-intersecting across the array of memory cells. These plurality of word lines 230 exhibit straightness at intersections with the source column that are adjacent to said source contact 280. This word lines straightness is also depicted in FIG. 2, specifically in the region of source contact 280.

Proceeding with flowchart 600 in FIG. 6B, a next step in the fabrication process 645 is the formation of a plurality of common source lines perpendicular to the source column. The common source lines 240 referred to in step 645 are shown in FIGS. 2, 3, 4, and 7G. The common source lines 240 are coupled with source regions 350. Each memory cell is associated with a source region. Source regions 350 in common source lines 240 are shared by neighboring word lines. For example, in FIG. 2, common source line 240 forms source regions for memory cells in word lines 230A and 230B. The common sources lines are permanently coupled with the implanted source column 260, thereby providing electrical coupling with said plurality of source regions 350.

Following the formation of common source lines, as shown in FIG. 6B, step 650, is the formation of common drain lines parallel to the common source lines. The common drain lines 270 are shown in FIGS. 2, 3 and 4 and have a row of drain contacts 275. The drain contacts 275 are shown in FIG. 7G, and are coupled to drain regions 360 of a row of memory cells. The row of drain contacts 275 is parallel to the common source line 240. In another embodiment, the formation of common drain lines (step 650) can be performed before the formation of common source lines (step 645).

Referring now to FIG. 6B and 7G, a next step 655 in the fabrication process is the formation of a source contact 280 collinear with the row of drain contacts 275. The source contact 280 is coupled with the implanted source column 260. The row of drain contacts 275 (containing a source contact 280) is perpendicular to the implanted source column 260, and the source contact 280 is connected with the implanted source column 260. In this way, an electrical coupling is formed between the implanted source column 260 and each of the source regions 350 in the array of memory cells.

The source contacts 280 are formed in line with a row of drain contacts 275. For example, as shown in FIG. 2, one source contact 280 is formed simultaneously and in-line with a pair of drain contacts 275. In that way, the word lines need not be altered, bent or re-routed to accommodate for the formation of source contacts.

The preferred embodiments of the present invention, an apparatus comprising an array of flash memory cells with a source line connection that facilitates straight word lines, and a method for producing the same by implanting n-type dopants into the silicon substrate to form a source column after the formation of the tunnel oxide layer and the first polysilicon layer, is thus described. While the present invention has been described in particular embodiments, it should be appreciated that the present invention should not be construed as limited by such embodiments, but rather construed according to the below claims.

What is claimed is:

1. A method of forming an implanted source column in a silicon substrate comprising;
    forming a layer of tunnel oxide over said silicon substrate having shallow trench isolation (STI) regions filled with an oxide material;
    forming a first layer of polysilicon over said layer of tunnel oxide;
    forming a first mask over said first layer of polysilicon to isolate a column parallel to the STI regions in said silicon substrate; and
    implanting dopants through said first layer of polysilicon and said layer of tunnel oxide and into said column in said silicon substrate to form said implanted source column.

2. The method as described in claim 1, wherein said forming a layer of tunnel oxide over said silicon substrate occurs after a formation of said STI regions in said silicon substrate.

3. The method of claim 1 wherein said dopants are n-type dopants.

4. The method of claim 1, farther comprising:
    forming a common source line in said silicon substrate, said common source line perpendicular to said implanted source column;
    coupling said common source line to a source region in said silicon substrate, wherein said source region is associated with a memory cell;
    permanently coupling said common source line to said implanted source column; and
    forming a source contact along a row of drain contacts associated with a row of memory cells perpendicular to said implanted source column, said source contact coupled to said implanted source column.

5. The method as described in claim 4, further comprising:
    before forming said plurality of common source lines in said silicon substrate, forming source and drain regions in said silicon substrate.

6. The method of claim 1, further comprising:
    after implanting said dopants into isolated region in said silicon substrate to form said source column, removing said first mask,
    defining said first layer of polysilicon;
    forming an interpoly dielectric layer over said first layer of polysilicon;
    forming a second layer of polysilicon over said interpoly dielectric layer; and
    performing stack gate definition to form a plurality of memory cells on said silicon substrate.

7. The method as described in claim 6 wherein said stack gate definition is accomplished by mask and etch processes.

8. The method as described in claim 6, further comprising:
    forming a plurality of word lines that are non-intersecting in said silicon substrate, said plurality of word lines coupled to a plurality of control gates in said silicon substrate, said plurality of word lines exhibiting straightness at intersections with said source column adjacent to said source contact.

* * * * *